(12) United States Patent
Yun

(10) Patent No.: US 7,952,403 B2
(45) Date of Patent: May 31, 2011

(54) UPDATE CONTROL APPARATUS IN DLL CIRCUIT

(75) Inventor: Won Joo Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/648,516

(22) Filed: Dec. 29, 2009

(65) Prior Publication Data

US 2011/0025390 A1 Feb. 3, 2011

(30) Foreign Application Priority Data

Jul. 30, 2009 (KR) .................. 10-2009-0070194

(51) Int. Cl.
*H03L 7/06* (2006.01)
(52) U.S. Cl. .................. 327/156; 327/147
(58) Field of Classification Search .................. None
See application file for complete search history.

(56) References Cited

U.S. PATENT DOCUMENTS

| | | | |
|---|---|---|---|
| 6,525,988 B2 | 2/2003 | Ryu et al. | |
| 6,781,861 B2 | 8/2004 | Gomm et al. | |
| 6,803,826 B2 | 10/2004 | Gomm et al. | |
| 7,069,458 B1 * | 6/2006 | Sardi et al. | 713/401 |
| 7,190,200 B2 * | 3/2007 | Byun | 327/158 |
| 7,205,806 B2 * | 4/2007 | Chong et al. | 327/158 |
| 7,348,819 B2 | 3/2008 | Choi | |
| 7,388,415 B2 | 6/2008 | Lee | |
| 7,821,312 B1 * | 10/2010 | Zheng | 327/158 |
| 2008/0042704 A1 | 2/2008 | Na | |
| 2009/0121784 A1 | 5/2009 | Lee et al. | |

FOREIGN PATENT DOCUMENTS

| | | |
|---|---|---|
| JP | 2003-101409 A | 4/2003 |
| JP | 2005-251370 A | 9/2005 |
| JP | 2007-095265 A | 4/2007 |
| JP | 2007-095283 A | 4/2007 |
| JP | 2007-097135 A | 4/2007 |
| JP | 2007-221750 A | 8/2007 |
| JP | 2008-217947 A | 9/2008 |
| KR | 1020080113971 A | 12/2008 |

* cited by examiner

*Primary Examiner* — Cassandra Cox
(74) *Attorney, Agent, or Firm* — Ladas & Parry LLP

(57) ABSTRACT

An update control apparatus in a DLL circuit is provided. The update control apparatus includes a logic value determination, a phase information collection unit, and an update control unit. The logic value determination unit is configured to determine a logic value of a phase detection signal for a first period interval of a reference clock signal to generate a phase information signal, and configured to extend the first period interval into a second period interval when an extension instruction signal is enabled. The phase information collection unit is configured to determine consecutive logic values of an update possible signal to generate the extension instruction signal, and configured to collect the phase information signal to generate an update information signal. The update control unit is configured to generate the update possible signal, a valid interval signal, and an update control signal in response to the update information signal.

11 Claims, 5 Drawing Sheets

UPDATE CONTROL APPARATUS IN DLL CIRCUIT

CROSS-REFERENCES TO RELATED APPLICATION

The present application claims priority under 35 U.S.C. §119(a) to Korean application number 10-2009-0070194, filed on Jul. 30, 2009, in the Korean Intellectual Property Office, which is incorporated herein by reference in its entirety as set forth in full.

BACKGROUND

1. Technical Field

The present invention relates to a semiconductor integrated circuit, and more particularly, to a delay locked loop (DLL) circuit provided in a semiconductor integrated circuit.

2. Related Art

In general, a DLL circuit provided in a semiconductor integrated circuit is used for providing an internal clock signal which leads the phase of a reference clock signal for a predetermined time. The reference clock signal being obtained by converting an external clock signal. As the internal clock signal utilized in the semiconductor integrated circuit is delayed through a clock buffer and a transfer line, a phase difference occurs between the internal clock signal and the external clock signal. Accordingly, the DLL circuit is used to solve such a problem that an output data access time increases. The DLL circuit performs such a control function that the internal clock signal leads the phase of the external clock signal for a predetermined time, in order to increase a valid data output interval.

FIG. 1 is a block diagram of a conventional DLL circuit.

Referring to FIG. 1, the DLL circuit includes: a clock input buffer 1 configured to buffer an external clock signal CLK_EXT to generate a reference clock signal CLK_REF; a delay line 2 configured to delay the reference clock signal CLK_REF in response to a delay control signal DLC and generate a delayed clock signal CLK_DLY; a clock driver 3 configured to drive the delayed clock signal CLK_DLY to generate an internal clock signal CLK_INT; a delay compensation unit 4 configured to delay the delayed clock signal CLK_DLY with a delay value obtained by modeling a delay value by delay elements provided on an output path of the delayed clock signal CLK_DLY, and generate a feedback clock signal CLK_FB; a phase detection unit 5 configured to compare the phase of the feedback clock signal CLK_FB with that of the reference clock signal CLK_REF to generate a phase detection signal PHD; an update control apparatus 6 configured to determine consecutive logic values of the phase detection signal PHD in response to the reference clock signal CLK_REF, and generate a valid interval signal VIT and an update control signal UDC; and a shift register 7 configured to update the logic value of the delay control signal DLC in response to the update control signal UDC when the valid interval signal VIT is enabled.

When the phase detection signal PHD is directly transferred to the shift register 7, the logic value of the phase detection signal PHD may change at a too short period. In this case, when the delay line 2 updates a delay amount, a malfunction may occur. To prevent such a malfunction, the update control apparatus 6 is provided to update a delay value which the shift register imparts to the delay line after the values of the phase comparison detection result are accumulated to a predetermined value.

In general, the update control apparatus 6 is implemented as a low-pass filter. That is, when the phase detection signal PHD consecutively maintains the same value for preset times, the update control apparatus 6 determines the logic value of the update control signal UDC in response to that. In general, however, the update control apparatus 6 determines the logic value of the phase detection signal PHD in response to a sample clock signal having the same frequency as the reference clock signal CLK_REF. Such an operation may significantly reduce the time for which the update control is apparatus 6 determines the logic value of the phase detection signal PHD. In such a state that the logic value determination time for the phase detection signal PHD is short, it is not easy to remove a high-frequency jitter of the phase detection signal PHD. Therefore, the reliability of the update control signal UDC inevitably decreases.

As such, the update control apparatus of the conventional DLL circuit does not have a configuration which stably performs an update operation to improve the stability of the DLL circuit.

SUMMARY

An update control apparatus in a delay locked loop (DLL) circuit, which improves the reliability of an update control signal and supports a stable delay fixation operation is described herein.

In one embodiment of the present invention, an update control apparatus in a DLL circuit includes: a logic value determination unit configured to determine a logic value of a phase detection signal for a first period interval of a reference clock signal to generate a phase information signal, and extend the first period interval into a second period interval when an extension instruction signal is enabled; a phase information collection unit configured to determine consecutive logic values of an update possible signal to generate the extension instruction signal, and collect the phase information signal to generate an update information signal; and an update control unit configured to generate the update possible signal, a valid interval signal, and an update control signal in response to the is update information signal.

In another embodiment of the present invention, an update control apparatus in a DLL circuit includes: a logic value determination unit configured to divide a reference clock signal to generate a divided reference clock signal in response to a division ratio instruction signal, determine a logic value of a phase detection signal in response to the divided reference clock signal, and generate a phase information signal; a phase information collection unit configured to determine consecutive logic values of an update possible signal to generate the division ratio instruction signal, and collect the phase information signal to generate an update information signal; and an update control unit configured to generate the update possible signal, a valid interval signal, and an update control signal in response to the update information signal.

BRIEF DESCRIPTION OF THE DRAWINGS

Features, aspects, and embodiments are described in conjunction with the attached drawings, in which.

DETAILED DESCRIPTION

Hereinafter, an update control apparatus of a delay locked loop (DLL) circuit according to the present invention will be described below with reference to the accompanying drawings through preferred embodiments.

Figure 1:
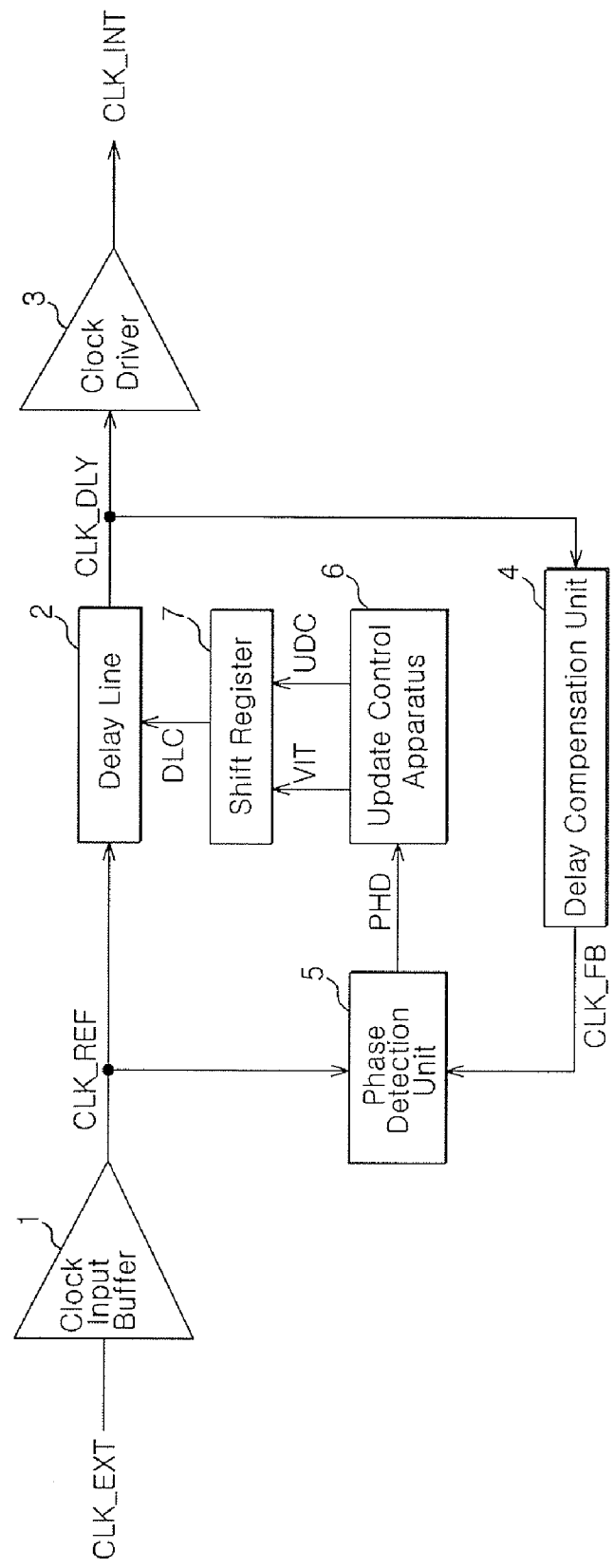
FIG. 1 is a block diagram of a conventional delay locked loop (DLL) circuit.
Figure 2:
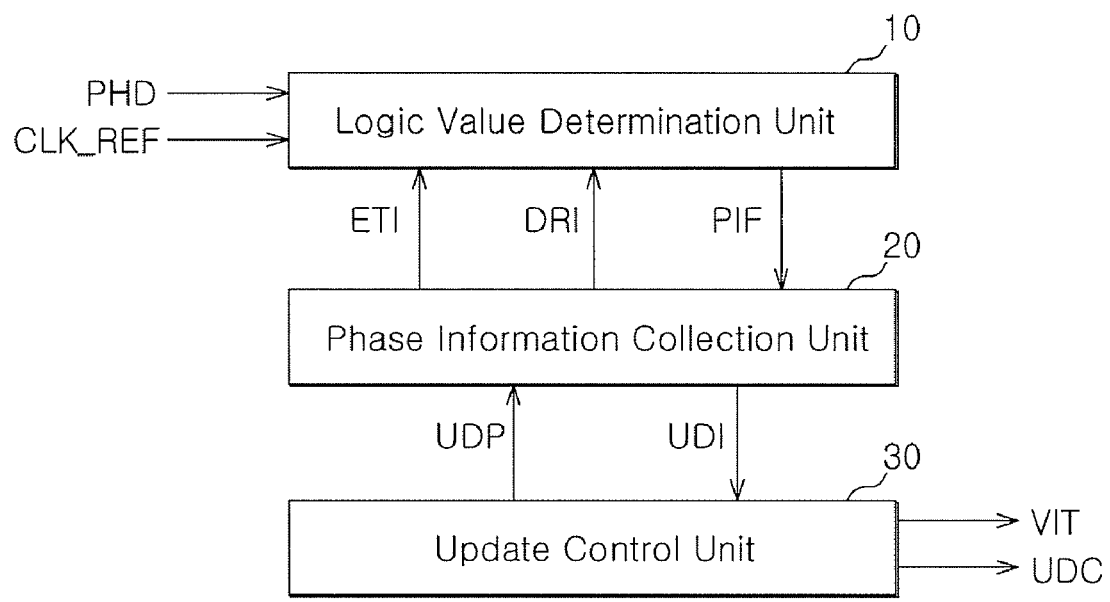
FIG. 2 is a configuration diagram of an update control apparatus of a DLL circuit according to one embodiment.

FIG. 2 is a configuration diagram of an update control apparatus of a DLL circuit according to one embodiment.

Referring to FIG. 2, the update control apparatus of the DLL circuit according to this embodiment includes a logic value determination unit 10, a phase information collection unit 20, and an update control unit 30. The logic value determination unit 10 is configured to determine a logic value of a phase detection signal PHD in response to an extension instruction signal ETI, a division ratio instruction signal DRI, and a reference clock signal CLK_REF and is configured to generate a phase information signal PIF. The phase information collection unit 20 is configured to generate the extension instruction signal ETI and the division ratio instruction signal DRI in response to an update possible signal UDP and to collect the phase information signal PIF to generate an update information signal UDI. The update control unit 30 is configured to generate the update possible signal UDP, an valid interval signal VIT, and an update control signal UDC in response to the update information signal UDI.

The logic value determination unit 10 determines the logic value of the phase detection signal PHD for a first period interval (for example, three periods) of the reference clock signal CLK_REF and outputs the determination result as the phase information signal PIF. The phase information signal PIF may be composed of a four-bit digital signal.

The extension instruction signal ETI is a signal which instructs the extension of the first period interval. When the extension instruction signal ETI is enabled, the logic value determination unit 10 performs an operation of determining the logic value of the phase detection signal PHD for a second period interval (for example, five periods) of the reference clock signal CLK_REF. The division ratio instruction signal DRI is a multiple-bit digital signal which instructs the division of the reference clock signal CLK_REF. The logic value determination unit 10 divides the reference clock signal CLK_REF at a ratio instructed by the division ratio instruction signal DRI, and determines the logic value of the phase detection signal PHD in response to the divided reference clock signal CLK_REF. That is, when the logic value determination unit 10 determines the to logic value of the phase detection signal PHD in response to the reference clock signal CLK_REF, then the logic value determination unit 10 can determine the logic value of the phase detection signal PHD for a longer time in response to the extension instruction signal ETI and/or the division ratio instruction signal DRI.

The phase information collection unit 20 receives the phase information signal PIF which is a four-bit digital signal, and collects only three bits among the four bits of the phase information signal PIF. Then, the phase information collection unit 20 outputs the collected bits as the update information signal UDI. After that, the logic value of the update possible signal UDP transferred from the phase information collection unit 20 is consecutively determined. When the update possible signal UDP consecutively has a preset logic value as many as preset times, the extension instruction signal ETI is enabled. Furthermore, the phase information collection unit 20 determines whether or not the extension instruction signal ETI is consecutively enabled as many as the preset times, and then increases the logic value of the division ratio instruction signal DRI.

When the extension instruction signal ETI is enabled, the phase information collection unit 20 combines three bits among the four bits of the phase information signal PIF through a different method from the previous method, and generates the three-bit update information signal UDI. At this time, the generation of the update information signal UDI by the phase information collection unit 20 is performed in such a manner that the bits of the phase information signal PIF which is generated when the logic value determination unit 10 determines the logic value of the phase information signal PHD for the second period interval of the reference clock signal CLK_REF are included in the update information signal UDI. That is, when the phase information signal PIF is generated by increasing the time for which the logic value determination unit 10 determines the logic value of the phase information signal PHD, then the phase information collection unit 20 reflects this in generating the update information signal UDI. As a result, the update information signal UDI includes the logic value information of the phase detection signal PHD which is determined for a longer time.

The update information signal UDI may be implemented as a digital signal composed of a combination of three bits. The update control unit 30 determines whether the respective bits of the update information signal UDI have the same logic value or not. When the respective bits of the update information signal UDI have the same logic value, the update control unit 30 enables the update possible signal UDP, and then enables the valid interval signal VIT. Furthermore, the update control unit 30 determines a logic value of the update control signal UDC depending on the logic values of the respective bits of the update information signal UDI.

As described above, in the update control apparatus of the DLL circuit according to this embodiment, the logic value determination unit 10 determines the logic value of the phase detection signal PHD for the first period interval of the reference clock to signal CLK_REF, and generates the phase information PIF. The phase information collection unit 20 generates the update information signal UDI using the phase information signal PIF, and the update control unit 30 generates the update possible signal UDP, the valid interval signal VIT, and the update control signal UDC in response to the is update information signal UDI. Then, the phase information collection unit 20 generates the extension instruction signal ETI and/or the division ratio instruction signal DRI in response to the update possible signal UDP. Furthermore, the phase information collection unit 20 determines the logic value of the phase detection signal PHD for the second period interval of the reference clock signal CLK_REF in response to the extension instruction signal ETI and/or the division ratio instruction signal DRI, or divides the reference clock signal CLK_REF and then determines the logic value of the phase detection signal PHD using the divided reference clock CLK_REF. Therefore, the time for which the logic value of the phase detection signal PHD is determined is increased.

The phase information collection unit 20 collects the phase information signal PIF generated through the above-described process to regenerate the update information signal UDI. The update control unit 30 repeats the operation of generating the update possible signal UDP, the valid interval signal VIT, and the update control signal UDC in response to the regenerated update information signal UDI.

As such, the update control apparatus of the DLL circuit can increase the time for which the logic value of the phase detection signal PHD is determined depending on conditions. Therefore, it is possible to narrow the band width of the update control apparatus of the DLL circuit, which serves as a low-pass filter. That is, the phase detection signal PHD can maintain the same logic value for a longer is time than in the related art such that the logic value of the update control signal UDC is changed. Therefore, a high-frequency jitter included in the phase detection signal PHD can be effectively removed. As a result, it is possible to improve the reliability of the update control signal UDC.

Figure 3:
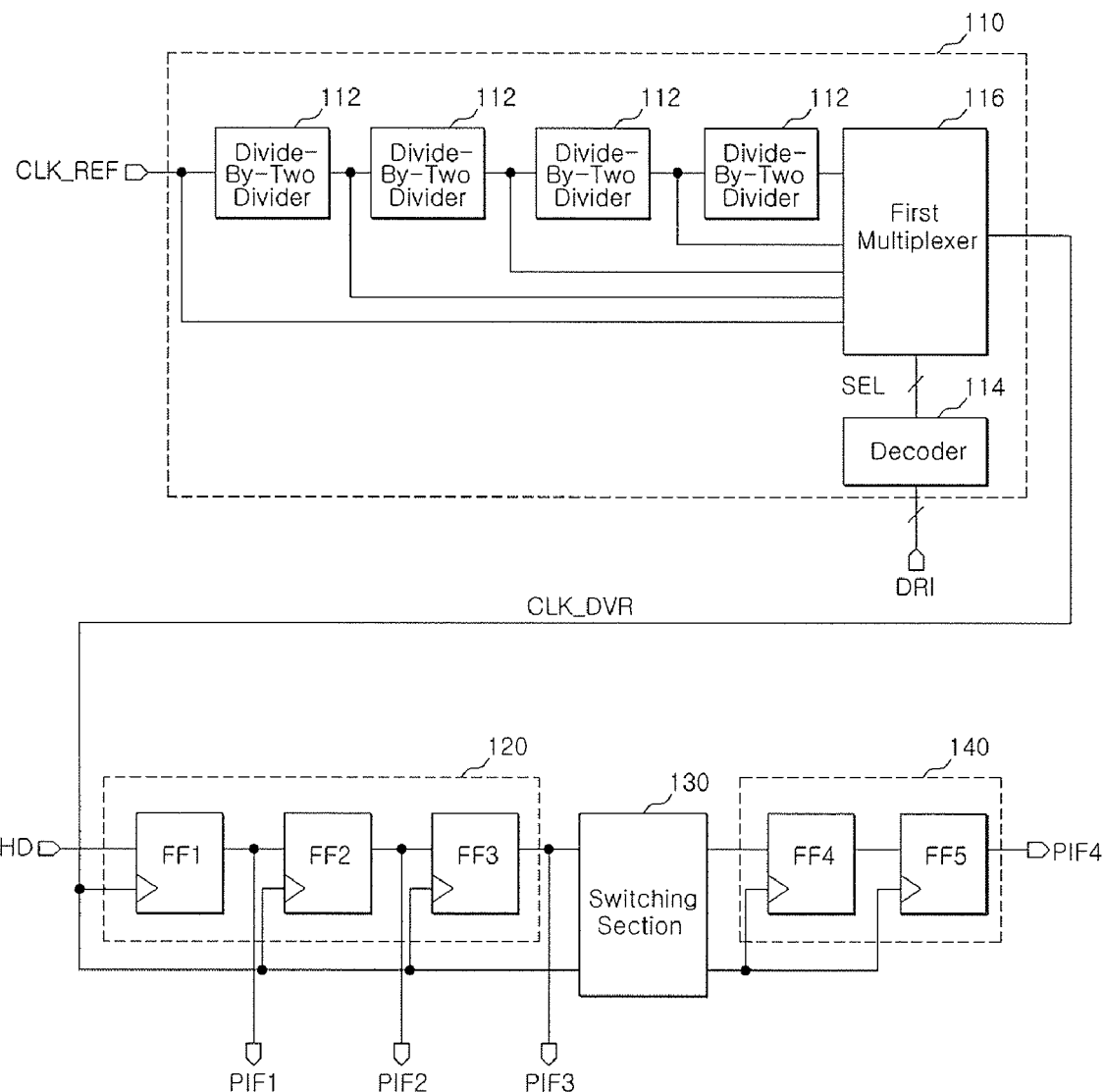
FIG. 3 is a detailed configuration diagram of a logic value determination unit illustrated in FIG. 2.

FIG. 3 is a detailed configuration diagram of the logic value determination unit illustrated in FIG. 2. In FIG. 2, the phase information signal PIF composed of four bits may be expressed as first through fourth phase information signals PIF1 through PIF4.

Referring to FIG. 3, the logic value determination unit 10 includes a clock division section 110 configured to divide the reference clock signal CLK_REF in response to the division ratio instruction signal DRI and generate a divided reference clock signal CLK_DRI, a basic latch section 120 configured to sequentially latch the phase detection signal PHD in response to the divided reference clock signal CLK_DRI and generate first through third phase information signals PIF1 through PIF3, a switching section 130 configured to pass the divided reference clock signal CLK_DRI and the third phase information signal PIF3 in response to the extension instruction signal ETI, and an extended latch section 140 configured to sequentially latch the third phase information signal PIF3 in response to the divided reference clock CLK_DRI transferred from the switching section 130 and generate a fourth phase information signal PIF4.

The clock division unit 110 includes a plurality of divide-by-is two dividers 112, a decoder 114, and a first multiplexer 116. In this embodiment, the clock division unit 10 includes four divide-by-two dividers 112. However, the number of divide-by-two dividers 112 may be changed. The four divide-by-two dividers 112 sequentially divide the reference clock signal CLK_REF by two. Accordingly, a clock signal outputted from the fourth divide-by-two divider 112 has a period 16 times larger than that of the reference clock signal CLK_REF.

The decoder 114 decodes the division ratio instruction signal DRI which is a multiple-bit digital signal, and generates a selection signal SEL for selecting any one of the reference clock signal CLK_REF and the output clock signal of each divide-by-two divider 112. Then, the first multiplexer 116 outputs any one of the reference clock signal CLK_REF and the output clock of each divide-by-two divider 112 as the divided reference clock signal CLK_REF in response to the selection signal SEL.

The division ratio instruction signal DRI has a logic value which causes the reference clock signal CLK_REF to be outputted as the divided reference clock signal CLK_DVR, at the initial stage. Then, whenever the logic value of the division ratio instruction signal DRI increases, the period of the divided reference clock signal CLK_DVR increases twice.

The basic latch unit 120 includes three flip-flops FF1 through FF3 connected in series. The respective flip-flops FF1 through FF3 operate in response to the divided reference clock signal CLK_DVR, and latch input signals to output the first through third phase information signals PIF1 through PIF3.

The switching section 130 transfers the divided reference clock signal CLK_DVR and the third phase information signal PIF3 to the extended latch section 140 when the extension instruction signal ETI is enabled. When the extension instruction signal ETI is disabled, the switching section 130 does not pass the divided reference clock signal CLK_DVR and the third phase information signal PIF3. Although not shown, the switching section 130 may be easily implemented by providing two pass gate devices.

The extended latch section 140 includes two flip-flops FF4 and FF5 connected in series. When the divided reference clock signal CLK_DVR and the third phase information signal PIF3 are transferred from the switching section 130, the two flip-flops FF4 and FF5 latch the third phase information signal PIF3 in response to the divided reference clock signal CLK_DVR. Then, the flip-flop FF5 provided at the last stage outputs a signal as the fourth phase information signal PIF4.

As such, the logic value determination unit 10 activates the three flip-flops FF1 through FF3 of the basic latch section 120, to sequentially latches the phase detection signal PHD in response to the reference clock signal CLK_REF, and outputs the first through fourth phase information signals PIF1 through PIF4. In this case, the extended latch section 140 is deactivated, and the fourth phase information signal PIF4 has an insignificant logic value.

When the extension instruction signal ETI is enabled, the logic value determination unit 10 activates the extended latch section 140, and sequentially latch the phase detection signal PHD through the five flip-flops FF1 through FF5 to generate the first through fourth phase information signals PIF1 through PIF4. In this case, the fourth phase information signal PIF4 has a significant logic value. That is, when the extension instruction signal ETI is enabled, the logic value determination unit 10 performs the logic value determination operation on the phase detection signal PHD for a longer time.

Meanwhile, the logic value determination unit 10 can double the period of the divided reference clock signal CLK_DVR in response to the division ratio instruction signal DRI. Such an operation can increase the time for which the logic value determination unit 10 performs the operation of determining the logic value of the phase detection signal PHD.

Figure 4:
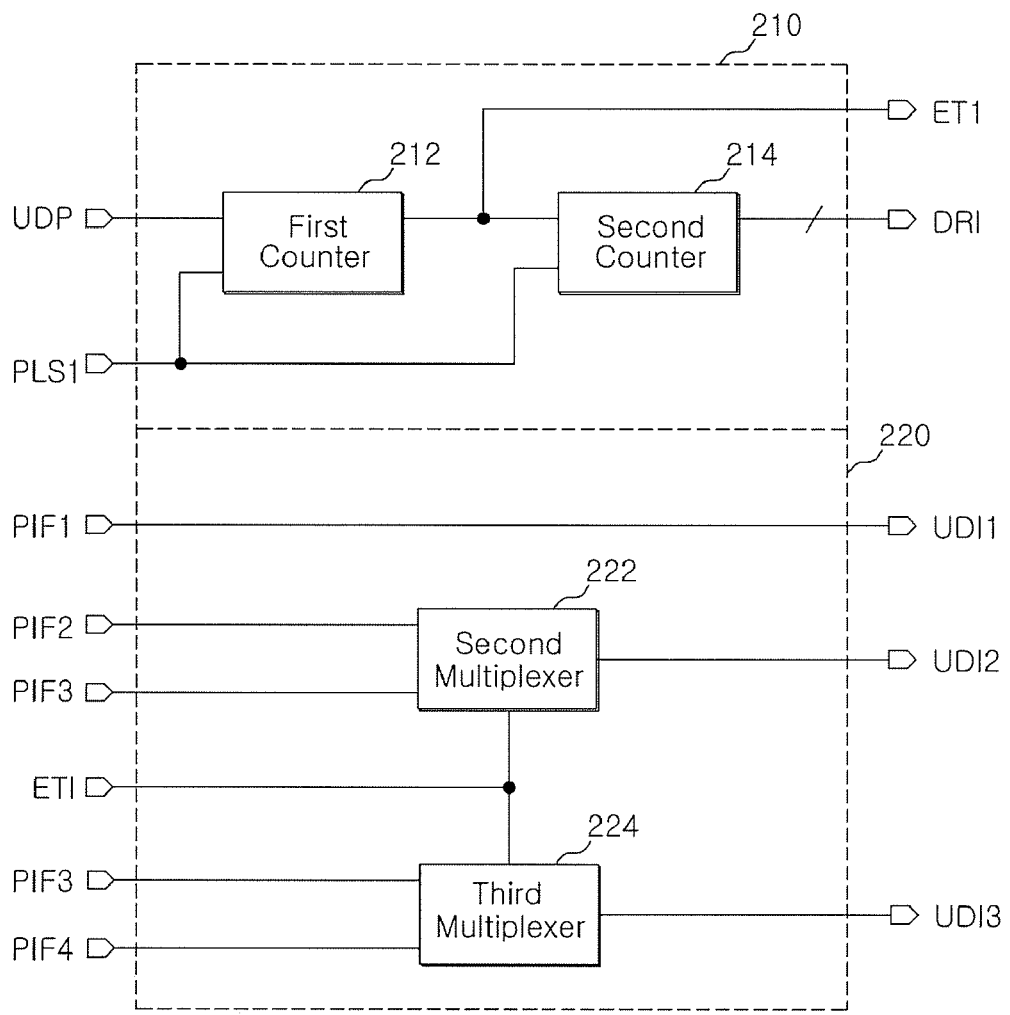
FIG. 4 is a detailed configuration diagram of a phase information collection unit illustrated in FIG. 2.

FIG. 4 is a detailed configuration diagram of the phase information collection unit illustrated in FIG. 2. In the following descriptions, the phase information signal PIF will be also expressed as first through fourth phase information signals PIF1 through PIF4. Furthermore, the three-bit update information signal UDI composed to of three bits will be expressed as first through third update information signals UDI1 through UDI3.

Referring to FIG. 4, the phase information collection unit 20 includes a counting section 210, and a signal extraction section 220. The counting section 210 is configured to count inputs of the update possible signal UDP in response to a first pulse signal PLS1 and configured to generate the extension instruction signal ETI and the division ratio instruction signal DRI. The signal extraction section 220 is configured to extract three signals among the first through fourth phase information signals PIF1 through PIF4 in response to the extension instruction signal ETI and to output the extracted signals as the first through third update information signals UDI1 through UDI3.

The counting section 210 includes first and second counters 212 and 214. The first counter 212 determines whether or not the update possible signal UDP consecutively has the same logic value while the first pulse signal PLS1 is toggled three times. When the update possible signal UDP consecutively has the same logic value, the extension instruction signal ETI is enabled. Then, the second counter 214 increases the logic value of the division ratio instruction signal DRI, whenever it is determined that the extension instruction signal ETI maintains the enable interval as many as predetermined times (for example, nine times) of the first pulse signal PLS1.

The first pulse signal PLS1 refers to a sample clock signal used in a general DLL circuit.

In the signal extraction section 220, the first phase to information signal PIF1 may be implemented as the first update information signal UDI1, as illustrated in FIG. 4. The signal extraction section 220 includes second and third multiplexers 222 and 224. When the extension instruction signal ETI is disabled, the second and third multiplexers 222 and 224 output the second phase information signal PIF2 and the third phase information signal PIF3 as the second update information signal UDI2 and the third update information signal UDI3, respectively. When the extension instruction signal ETI is enabled, the second and third multiplexers 222 and 224 output the third phase information signal PIF3 and the fourth information signal PIF4 as the second update information signal UDI2 and the third update information signal UDI3, respectively.

As such, the phase information collection unit 20 collects the phase information signals PIF1 through PIF3 transferred from the logic value determination unit 10 at the initial stage, and generates the update information signals UDI1 through UID3. Then, when the update possible signal UDP delivers such information that an update operation is consecutively performed, the phase information collection unit 20 enables the extension instruction signal ETI in response to the information. Furthermore, the phase information collection unit 20 collects the phase information signals PIF1, PIF3, and PIF4 which are generated when the logic value of the phase detection signal PHD is determined for a relatively long time in response to the extension instruction signal ETI, and then transfers the collected signals as the update information signals UDI1 through UDI3 to the update control unit 30.

Figure 5:
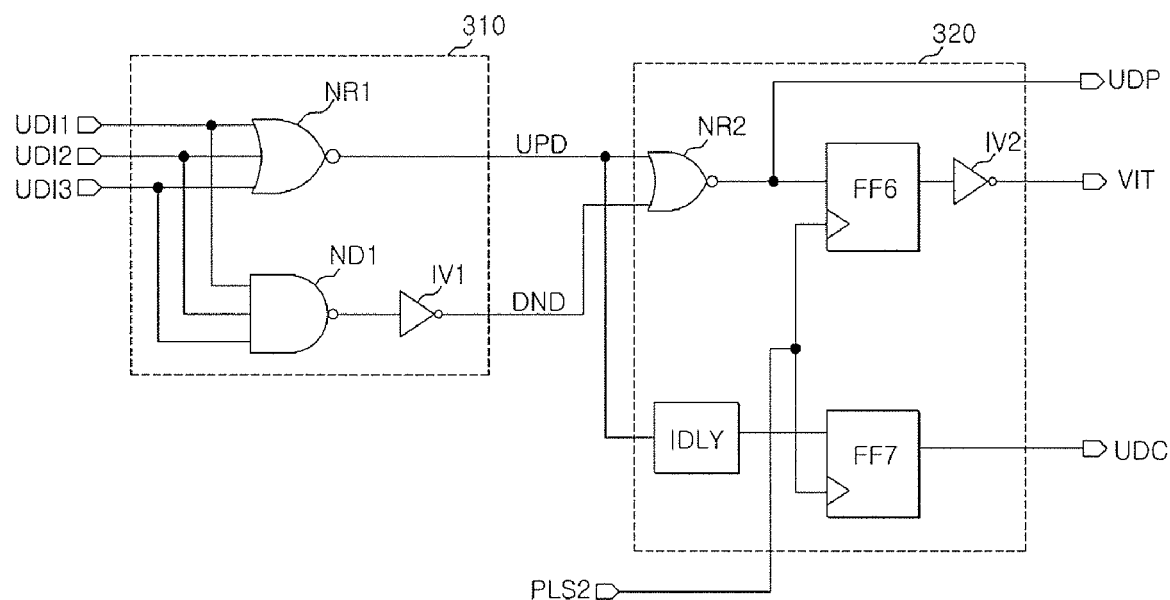
FIG. 5 is a detailed configuration diagram of an update control unit illustrated in FIG. 2.

FIG. 5 is a detailed configuration diagram of the update control unit illustrated in FIG. 2. In the following descriptions, the update information signal UDI will be expressed as first through third update information signals UDI1 through UDI3.

Referring to FIG. 5, the update control unit 30 includes an up/down detection section 310, and an up/down instruction section 320. The up/down detection section 310 is configured to detect the phases of the first through third update information signals UDI1 through UDI3 to generate an up detection signal UPD and a down detection signal DND. The up/down instruction section 320 is configured to generate the update possible signal UDP, the valid interval signal VIT, and the update control signal UDC in response to the up detection signal UPD and the down detection signal DND.

The up/down detection section 310 includes a first NOR gate NR1, a first NAND gate ND1, and a first inverter IV1. The first NOR gate NR1 is configured to receive the first through third update information signals UDI1 through UDI3 to output the up detection signal UPD. The first NAND gate ND1 is configured to receive the first through third update information signals UDI1 through UDI3. The first inverter IV1 is configured to receive an output signal of the first NAND gate ND1 to output the down detection signal DND.

The up/down instruction section 320 includes a second NOR gate NR2, a first flip-flop FF6, a second inverter IV2, an inversion delay IDLY, and a second flip-flop FF7. The second NOR gate NR2 is configured to receive the up detection signal UPD and the down detection signal DND to output the update possible signal UDP. The first flip-flop FF6 is configured to latch the update possible signal UDP in response to a second pulse signal PLS2. The second inverter IV2 is configured to receive an output signal of the first flip-flop FF6 to output the valid interval signal VIT. The inversion delay IDLY is configured to invert and delay the up detection signal UPD. The second flip-flop FF7 is configured to latch an output signal of the inversion delay IDLY in response to the second pulse signal PLS2 and output the update control signal UDC.

The second pulse signal PLS2 is a sample clock signal used in a general DLL circuit.

In such a configuration, the up/down detection section 310 enables the up detection signal UPD when the first through third update information signals UDI1 through UDI3 have a first logic value (logic "low"), and enables the down detection signal DND when the first through third update information signals UDI1 through UDI3 have a second logic value (logic "high").

When any one of the up detection signal UPD and the down detection signal DND is enabled, the up/down instruction section 320 enables the update possible signal UDP. The update possible signal UDP is a low enable signal. Then, the up/down instruction section 320 enables the valid interval signal VIT in response to the second pulse signal PLS2. Furthermore, the up/down instruction section 320 inverses and delays the up detection signal UPD, latches the inversed and delayed signal in response to the second pulse signal PLS2, and outputs the latched signal as the update control signal UDC. The valid interval signal VIT defines an interval during which a shift register recognizes the update control signal UDC, and the update control signal UDC performs a function of making an instruction such that a logic value of a delay control signal transferred to a delay line by the shift register increases or decreases.

As such, when the first through third update information signals UDI1 through UDI3 have the same logic value, the phase detection signal PHD maintains the same logic value for a predetermined interval. The update control unit 30 detects such a state to enable the update possible signal UDP, and generates the valid interval signal VIT and the update control signal UDC. Then, the update control unit 30 performs the same operation on the input of the first through third update information signals UDI1 through UDI3 which are generated when the logic value of the phase detection signal PHD is determined for a longer interval than before, and outputs the valid interval signal VIT and the update control signal UDC as a result of the operation. Accordingly, the result in which the logic value determination unit 10 and the phase information unit 20 determine the logic value of the phase detection signal PHD for a longer time is reflected into the valid interval signal VIT and the update control signal UDC.

As described above, the update control apparatus of the DLL circuit according to the embodiment increases the time for which a logic value of a phase detection signal is determined, when it is determined that the phase detection signal has the same logic value for a predetermined interval. Then, the update control apparatus determines the logic value of the phase detection signal for a longer time, and then generates a valid interval signal and an update control signal. Through such an operation, the update control apparatus of the DLL circuit serving as a low-pass filter can effectively remove a high-frequency jitter included in the phase detection signal. Accordingly, the update control apparatus can improve the reliability of the update control signal and support a more stable operation of the DLL circuit.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. An update control apparatus in a delay locked loop (DLL) circuit, comprising:
   a logic value determination unit configured to determine a logic value of a phase detection signal for a first period interval of a reference clock signal to generate a phase information signal, and configured to extend the first period interval into a second period interval when an extension instruction signal is enabled;
   a phase information collection unit configured to determine consecutive logic values of an update possible signal to generate the extension instruction signal, and configured to collect the phase information signal to generate an update information signal; and
   an update control unit configured to generate the update possible signal, a valid interval signal, and an update control signal in response to the update information signal.

2. The update control apparatus according to claim 1, wherein the phase information signal is composed of a multiple-bit digital signal, and
   the logic value determination unit comprises:
   a basic latch section configured to sequentially latch the phase detection signal in response to the reference clock signal, and configured to generate the multiple-bit phase information signal;
   a switching section configured to pass the reference clock signal and the least significant bit of the phase information signal in response to the extension instruction signal; and
   an extended latch section configured to sequentially latch the least significant bit of the phase information signal transferred from the switching section in response to the reference clock signal transferred from the switching section, and configured to generate an additional bit of the phase information signal.

3. The update control apparatus according to claim 2, wherein the phase information collection unit is configured to enable the extension instruction signal when the update possible signal consecutively has a preset logic value.

4. The update control apparatus according to claim 3, wherein the update information signal is composed of a multiple-bit digital signal, and
   the phase information collection unit is configured to combine only bits of the phase information signal generated from the basic latch section to generate the update information signal when the extension instruction signal is disabled, and configured to combine bits of the phase information signal generated from the basic latch section and bits of the phase information signal generated from the extended latch section to generate the multiple-bit update information signal when the extension instruction signal is enabled.

5. The update control apparatus according to claim 4, wherein the phase information collection unit comprises:
   a counting section configured to count inputs of the update possible signal in response to a pulse signal and configured to generate the extension instruction signal; and
   a signal extraction section configured to extract the multiple-bit update information signal from the bits of the phase information signal in response to the extension instruction signal.

6. The update control apparatus according to claim 5, wherein the update control unit comprises:
   an up/down detection section configured to detect the phase of the update information signal to generate an up detection signal and a down detection signal; and
   an up/down instruction section configured to generate the update possible signal, the valid interval signal, and the update control signal in response to the up detection signal and the down detection signal.

7. An update control apparatus in a DLL circuit, comprising:
   a logic value determination unit configured to divide a reference clock signal to generate a divided reference clock signal in response to a division ratio instruction signal, and configured to determine a logic value of a phase detection signal in response to the divided reference clock signal, and generate a phase information signal;
   a phase information collection unit configured to determine consecutive logic values of an update possible signal to generate the division ratio instruction signal, and configured to collect the phase information signal to generate an update information signal; and
   an update control unit configured to generate the update possible signal, a valid interval signal, and an update control signal in response to the update information signal.

8. The update control apparatus according to claim 7, wherein the phase information signal is composed of a multiple-bit digital signal, and
   the logic value determination unit comprises:
   a clock division section configured to divide the reference clock signal to generate a divided reference clock signal in response to the division ratio instruction signal; and
   a latch section configured to sequentially latch the phase detection signal in response to the divided reference clock signal to generate the multiple-bit phase information signal.

9. The update control apparatus according to claim 8, wherein the phase information collection unit is configured to increase the logic value of the division ratio instruction signal when the update possible signal consecutively has a preset logic value.

10. The update control apparatus according to claim 9, wherein the update information signal is composed of a multiple-bit digital signal, and
    the phase information collection unit comprises:
    a counting section configured to count inputs of the update possible signal in response to a pulse signal, and configured to generate the extension instruction signal and the division ratio instruction signal; and
    a signal extraction section configured to extract the multiple-bit update information signal from bits of the phase information signal in response to the extension instruction signal.

11. The update control apparatus according to claim 10, wherein the update control unit comprises:
    an up/down detection section configured to detect the phase of the update information signal to generate an up detection signal and a down detection signal; and
    an up/down instruction section configured to generate the update possible signal, the valid interval signal, and the update control signal in response to the up detection signal and the down detection signal.

* * * * *